(12) United States Patent
Kimura et al.

(10) Patent No.: US 11,616,339 B2
(45) Date of Patent: Mar. 28, 2023

(54) LIGHT SOURCE DEVICE

(71) Applicant: NICHIA CORPORATION, Anan (JP)

(72) Inventors: Yoshihiro Kimura, Yokohama (JP);
Tadaaki Miyata, Yokohama (JP)

(73) Assignee: NICHIA CORPORATION, Anan (JP)

(*) Notice: Subject to any disclaimer, the term of this patent is extended or adjusted under 35 U.S.C. 154(b) by 227 days.

(21) Appl. No.: 17/108,872

(22) Filed: Dec. 1, 2020

(65) Prior Publication Data

US 2021/0167576 A1    Jun. 3, 2021

(30) Foreign Application Priority Data

Dec. 2, 2019 (JP) .............................. JP2019-217957
Jul. 7, 2020 (JP) .............................. JP2020-116958

(51) Int. Cl.
*H01S 5/0683* (2006.01)
*H01S 5/02255* (2021.01)
*H01S 5/40* (2006.01)
*H01S 5/02216* (2021.01)

(52) U.S. Cl.
CPC ........ *H01S 5/0683* (2013.01); *H01S 5/02216* (2013.01); *H01S 5/02255* (2021.01); *H01S 5/4031* (2013.01)

(58) Field of Classification Search
CPC .. H01S 5/02255; H01S 5/0225; G02B 6/4286
USPC .................................................... 372/29.011
See application file for complete search history.

(56) References Cited

U.S. PATENT DOCUMENTS

| | | | |
|---|---|---|---|
| 4,297,653 A | 10/1981 | Scifres et al. | |
| 4,893,296 A | 1/1990 | Matsumoto et al. | |
| 5,438,586 A | 8/1995 | Ishii et al. | |
| 6,081,638 A | 6/2000 | Zhou | |
| 11,152,758 B2 * | 10/2021 | Miura | H01S 5/02326 |
| 2003/0002799 A1 | 1/2003 | Melchior et al. | |
| 2003/0007067 A1 | 1/2003 | Masuda et al. | |
| 2006/0226432 A1 | 10/2006 | Nemoto | |
| 2013/0039374 A1 * | 2/2013 | Lutgen | H01S 5/02253 372/43.01 |

(Continued)

FOREIGN PATENT DOCUMENTS

| | | |
|---|---|---|
| JP | S55-145386 A | 11/1980 |
| JP | S64-033734 A | 2/1989 |
| JP | H06-169136 A | 6/1994 |

(Continued)

*Primary Examiner* — Tuan N Nguyen
(74) *Attorney, Agent, or Firm* — Foley & Lardner LLP

(57) ABSTRACT

A light source device includes: first and second laser diodes; a reflector having: first and second reflecting faces configured to reflect a portion of light from the respective first and second laser diodes and to transmit a portion of the light from the respective first and second laser diodes, and first and second exit faces configured to allow the portions of the light transmitted through the respective first and second reflecting faces to exit; and a photodetector including: first and second light receiving element configured to receive light exiting the first and second exit faces, respectively. The reflector is configured such that the light transmitted through the first reflecting face is hindered from exiting the second exit face and the light transmitted through the second reflecting face is hindered from exiting the first exit face.

12 Claims, 14 Drawing Sheets

(56) References Cited

U.S. PATENT DOCUMENTS

2019/0171091 A1 6/2019 Motobayashi et al.
2020/0280162 A1 9/2020 Price et al.

FOREIGN PATENT DOCUMENTS

| JP | 2002-350604 A | 12/2002 |
|---|---|---|
| JP | 2003-037328 A | 2/2003 |
| JP | 2003-519823 A | 6/2003 |
| JP | 2003-332699 A | 11/2003 |
| JP | 2004-220675 A | 8/2004 |
| JP | 2005-070519 A | 3/2005 |
| JP | 2005-158822 A | 6/2005 |
| JP | 2011-049338 A | 3/2011 |
| WO | WO-2018/034055 A1 | 2/2018 |
| WO | WO-2020/176241 A1 | 9/2020 |
| WO | WO-2021/063994 A2 | 4/2021 |

* cited by examiner

LIGHT SOURCE DEVICE

CROSS-REFERENCE TO RELATED APPLICATIONS

This application claims priority to Japanese Patent Application No. 2019-217957, filed on Dec. 2, 2019, and Japanese Patent Application No. 2020-116958, filed on Jul. 7, 2020, the disclosures of which are hereby incorporated by reference in their entireties.

BACKGROUND

The present disclosure relates to a light source device.

Alight source device equipped with a plurality of laser diodes is being developed for various applications. Japanese Patent Publication No. 2011-049338 discloses a light source device comprising a laser array and an upward reflection mirror that reflects upwards the laser beams emitted by the laser array.

SUMMARY

One object of certain embodiments of the present invention is to provide a light source device capable of monitoring laser beam outputs with high accuracy.

According to one embodiment, a light source device includes: a first laser diode, a second laser diode, a reflector, a photodetector, and a base. The reflector has a first reflecting face, a second reflecting face, a first exit face, and a second exit face. The first reflecting face reflects a portion of light from the first laser diode and transmits a portion of the light from the first laser diode. The second reflecting face reflects a portion of light from the first laser diode and transmits a portion of the light from the second laser diode. The first exit face allows the portion of the light transmitted through the first reflecting face to exit. The second exit face allows the portion of the light transmitted through the second reflecting face to exit. The photodetector includes a first light receiving element that receives first light exiting the first exit face, and a second light receiving element that receives second light exiting the second exit face. The base directly or indirectly supports the first laser diode, the second laser diode, the reflector, and the photodetector. The reflector is a light shielding body that hinders the light transmitted through the first reflecting face from exiting the second exit face and the light transmitted through the second reflecting face from exiting the first exit face.

According to certain embodiments of the present disclosure, a light source device capable of monitoring laser beam outputs with high accuracy can be provided.

DETAILED DESCRIPTION

Figure 1:
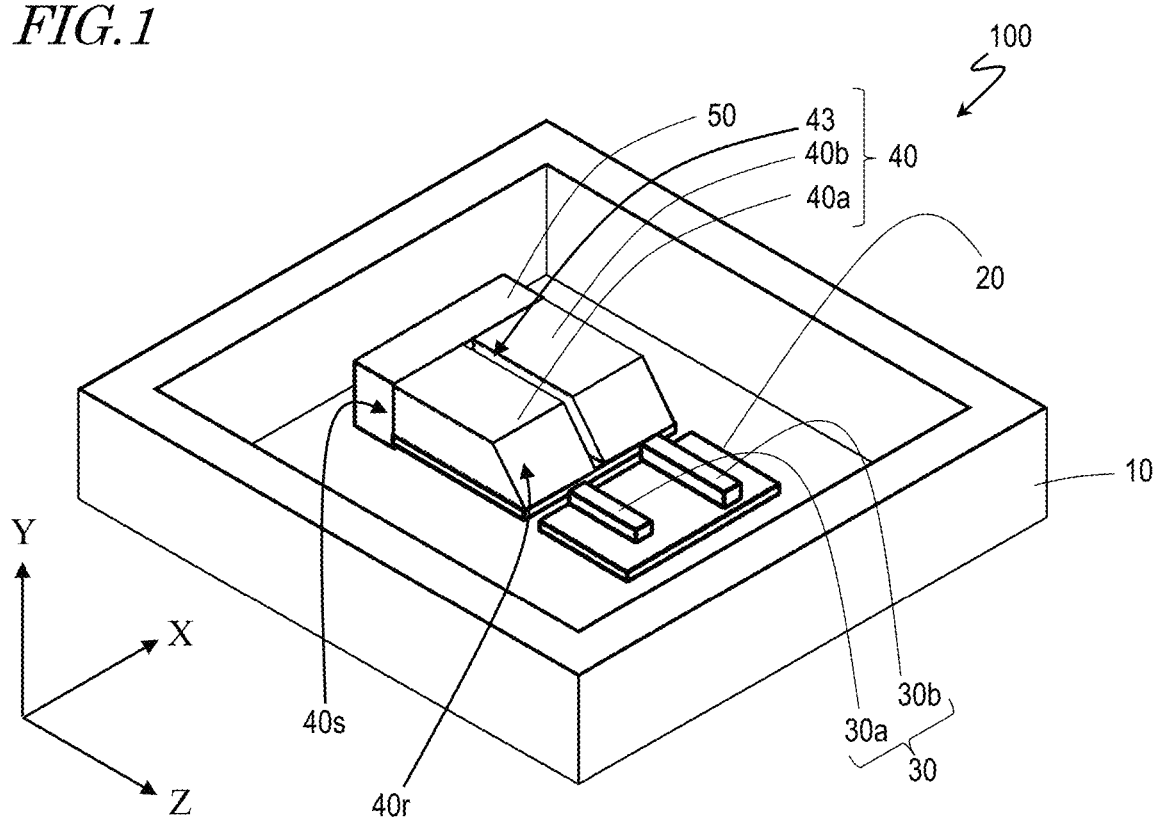
FIG. 1 is a perspective view schematically showing an example of a light source device according to an illustrative embodiment of the present disclosure.

Certain embodiments of the present disclosure will be explained below in detail with reference to the accompanying drawings. The embodiments below are illustrative, and the light source device according to the present disclosure is not limited to the embodiments described below. For example, the numerical values, shapes, materials, processes, and the order of the processes shown in the embodiments below are merely examples, and can be changed in various ways to the extent that such changes do not cause any technical inconsistency. The various embodiments explained below are merely illustrative, and can be combined in various ways to the extent that such combinations do not cause any technical inconsistency.

The dimensions, shapes, and the like of the constituent elements shown in the drawings may be exaggerated for clarity of explanation, and may not reflect the dimensions, shapes, and relative sizes in an actual light source device. There may be occasions in which some elements are not shown in the drawings in order to prevent the drawings from becoming excessively complex.

In the explanation below, constituent elements having substantially the same functions are denoted with common reference numerals, and repeated explanation of such elements may be omitted. Terms indicating certain directions or positions (e.g., "upper," "lower," "right," "left," and other phrases including these) may be used. However, these terms are merely used to make the relative directions or positions to be easily understood in the drawings being referenced. So long as the relationship between the relative directions or positions indicated by the terms, such as "upper," "lower," or the like, is the same as that shown in a drawing being referenced, the parts or members in any drawing outside of the present disclosure, actual product, or manufacturing equipment do not have to be arranged in the same manner as that shown in the referenced drawing.

Figure 2:
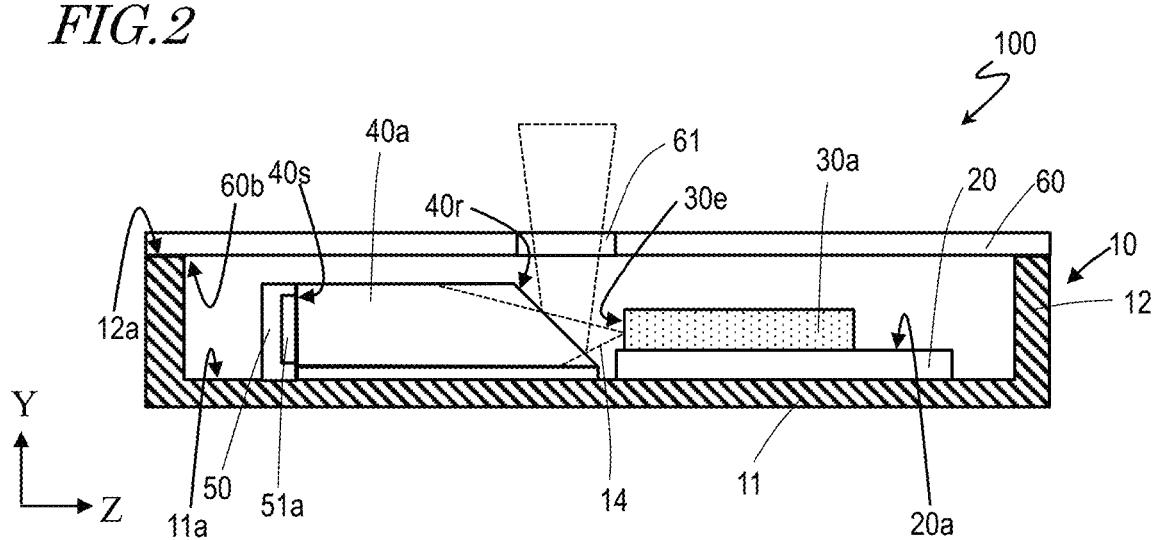
FIG. 2 is a cross-sectional view schematically showing the light source device according to the illustrative embodiment of the present disclosure taken in parallel with a YZ plane.
Figure 3:
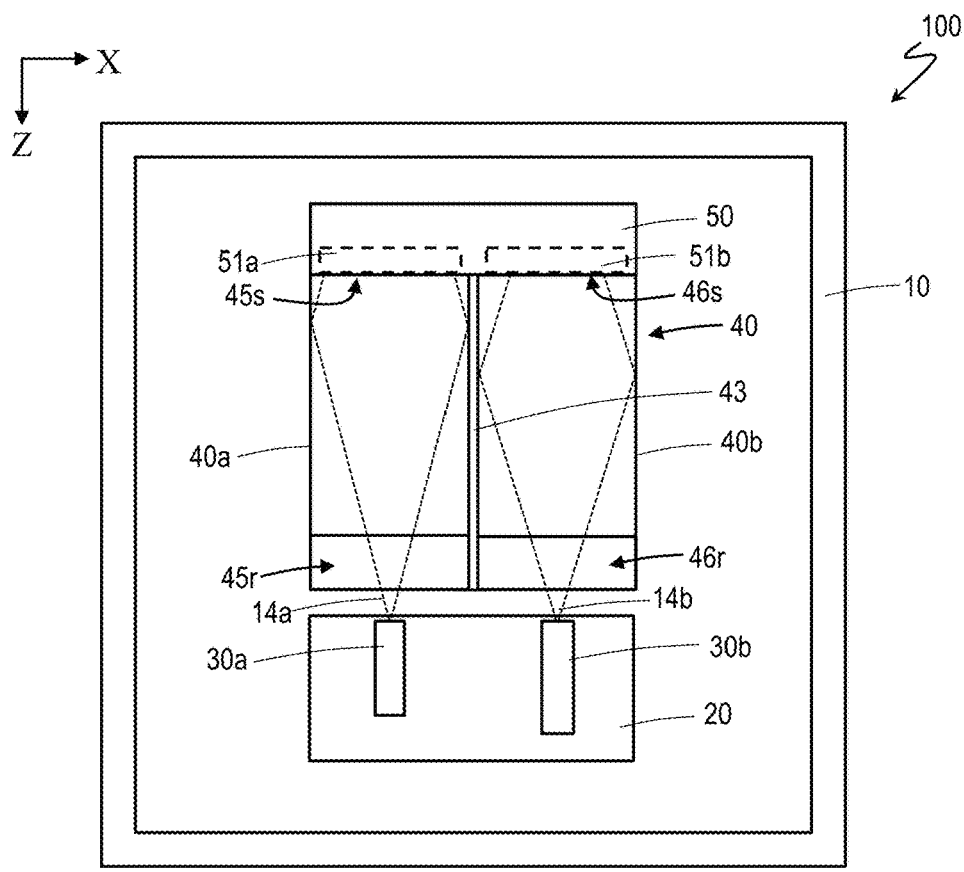
FIG. 3 is a plan view schematically showing the example of the light source device according to the illustrative embodiment of the present disclosure.

The structure of a light source device according to one embodiment will be explained with reference to FIG. 1 to FIG. 3. FIG. 1 is a perspective view schematically showing an example of a light source device 100 according to the embodiment. FIG. 2 is a cross-sectional view of the light source device 100 taken in parallel with a YZ plane in FIG. 1. FIG. 2 shows a cross section that includes constituent elements 30a and 40a. FIG. 3 is a plan view schematically showing the light source device 100 according to the embodiment. For reference purposes, an X-axis, a Y-axis, and a Z-axis that are orthogonal with one another are provided in the accompanying drawings.

The light source device 100 includes a base 10, a submount 20, laser diodes 30, a reflector 40, a photodetector 50, and a cap 60. In the perspective view in FIG. 1, the cap 60 is not shown for convenience's sake. In the example shown in FIG. 1, the laser diodes 30 include a first laser diode 30a and a second laser diode 30b.

As one example, the shape of the light source device 100 is substantially parallelepiped-shaped. For example, the size of the light source device 100 can be in a range of about 3.0 mm to about 5.0 mm in the X direction and in a range of about 3.0 mm to about 5.0 mm in the Z direction, while the thickness can be in a range of about 1.0 mm to about 3.0 mm in the Y direction. The light source device 100 capable of monitoring the laser beams 14 output by the first laser diode 30a and the second laser diode 30b can be suitably utilized as a miniature light source device required by a display device such as a head-mounted display (HMD), in which the display is positioned in close proximity to the eyes of a user.

The base 10 has a sheet-shaped bottom part 11 and a frame-shaped wall part 12. The bottom part 11 and the wall part 12 are integrally formed. The bottom part 11 has a support face 11a that directly or indirectly supports the first laser diode 30a, the second laser diode 30b, the reflector 40, and the photodetector 50. However, the bottom part 11 and the wall part 12 can be formed as separate members. In this case, the wall part 12 is joined with the support face 11a of the bottom part 11.

The wall part 12 is positioned along the perimeter of the bottom part 11 so as to surround the submount 20, on which the first laser diode 30a and the second laser diode 30b, the reflector 30, and the photodetector 50 are mounted, as well as defining the space accommodating these. The base 10 can be formed using a ceramic as a main material. The materials that can be used for the base 10 are not limited to ceramics, and metals can alternatively be used. For example, a ceramic material, such as aluminum nitride, silicon nitride, aluminum oxide, and silicon carbide, a metal, such as copper, aluminum, and iron, a composite material, such as copper-molybdenum, copper-diamond, and copper-tungsten, as well as silicone and a resin can be used as a main material for the base.

The submount 20 is bonded to the support face 11a of the bottom part 11. Such bonding is achieved via an inorganic material layer such as a metal layer, or an organic material layer. In the case of employing a blue or green emitting laser diode, however, the use of an organic material is preferably avoided, considering the dust collection effect attributable to laser beams. The submount 20 has a mounting face 20a where the first laser diode 30a and the second laser diode 30b are arranged. The first laser diode 30a and the second laser diode 30b are mounted on the support face 11a of the bottom part 11 in the state of being fixed to the submount 20.

The submount 20 is a heat dissipating member typically shaped as a parallelepiped, but the shape is not limited to the parallelepiped shape. The submount 20 plays a role of dissipating the heat generated by the laser diodes. From the perspective of further improving the heat dissipation properties, the submount 20 is preferably formed by using a material having a higher coefficient of thermal conductivity than those of the laser diodes. For such a material, a ceramic material, such as AlN, SiC, and SiN, or a metal material that includes at least one selected from the group of Cu, Al, Ag, Fe, Ni, Mo, Cu, W, and CuMo, can be used.

The submount 20 can also adjust the emission positions of the laser beams 14 from the laser diodes. Considering the relative position to the reflector 40 described below, the emission positions of the laser beams 14 can be set higher to adjust the positions of the beams being irradiated on the reflector 40. The submount 20 can also hinder the laser beams 14 from hitting the base 10, thereby reducing the output losses of the laser beams.

In the example shown in FIG. 1 or FIG. 2, the laser diodes 30 include a first laser diode 30a and a second laser diode 30b, but the number of laser diodes is not so limited; the laser diodes 30 can include three or more laser diodes. The first laser diode 30a and the second laser diode 30b can be disposed on the submount 20 at an interval of 0.1 mm to 5.0 mmm, for example. Here, the interval represents the distance between the central axes of the laser beams 14 from adjacent two laser diodes.

A laser diode 30 has a semiconductor stack structure (not shown) that includes p-side electrode, a n-side electrode, a p-side semiconductor layer, a n-side semiconductor layer, and an active layer interposed between these layers. One end of the active layer is the emission end face (or the emission region) 30e from which a laser beam 14 is emitted. A laser beam 14 is emitted from the emission end face 30e of the laser diode 30 when an electric current is allowed to internally flow by applying a voltage to the p-side electrode and the n-side electrode.

For the laser diodes, for example, a laser diode that emits blue light, green light, or red light can be employed. In addition, a laser diode that emits other light, such as infrared or ultraviolet light can be employed. The multiple laser diodes 30 can be designed to respectively emit laser beams with the same peak emission wavelength, or different peak emission wavelengths.

In this embodiment, the peak emission wavelength of the first laser diode 30a differs from the peak emission wavelength of the second laser diode 30b. The first laser diode 30a and the second laser diode 30b can be a combination of two selected from red, green, and blue laser diodes. For example, the first laser diode 30a is a blue light emitting laser diode, and the second laser diode 30b is a green light emitting laser diode.

In the description herein, blue light is light having a peak emission wavelength in the range of from 420 nm to 494 nm, green light is light having a peak emission wavelength in the range of from 495 nm to 570 nm, and red light is light having a peak emission wavelength in the range of from 605 nm to 750 nm.

Examples of a blue or green light emitting laser diode include those that include nitride semiconductors. For nitride semiconductors, GaN, InGaN, and AlGaN can be used, for example. Examples of red light emitting laser diodes include those that include InAlGaP, GaInP, GaAs, and AlGaAs semiconductors.

The laser beams 14 emitted by the laser diodes 30 diverge, each forming an elliptical far field pattern (hereinafter referred to as "FFP") in a plane parallel to the emission end face 30e. An FFP is defined by the light intensity distribution of a laser beam 14 at a position distant from the emission end face 30e. The intensity distribution can be approximated by a Gaussian distribution. In the light intensity distribution, the portion having the intensity of at least $1/e^2$ of the peak intensity can be referred to as a beam cross section.

In this embodiment, a laser diode 30 is of an edge-emitting type that has an end face from which a laser beam 14 is emitted, but can be of a surface-emitting (VCSEL) type. The laser beam 14 can be collimated or converged by an optical system that includes a lens, not shown in the drawings. Such an optical system can be provided inside or outside of the light source device 100.

The reflector 40 is an upward reflection mirror that reflects upwards the laser beams emitted by the multiple laser diodes. The reflector 40 is fixed to the support face 11a of the bottom part 11. The reflector 40 has a reflecting face 40r and an exit face 40s located opposite to the reflecting face 40r. The reflecting face 40r reflects a portion of each of the laser beams 14 emitted by the first laser diode 30a and the second laser diode 30b towards the cap 60 of the light source device 100 while transmitting a portion of each of the laser beams 14. The exit face 40s allows the portion of the light transmitted through the reflecting face 40r to exit. The reflecting face 40r is an oblique face of the reflector 40, and the angle formed by the reflecting face 40r and the support face 11a of the bottom part 11 is 45 degrees, for example. The outer portion of the reflector 40 can be formed using a base material, for example, glass or metal. Considering heat resistance and light resistance, the base material is desirably a highly heat resistant material having a high transmittance for the wavelengths of light emitted by the laser diodes used. Examples of the base material can include glass, such as quartz, BK7 (borosilicate glass), non-alkali glass, and alkali glass, metals, such as aluminum thin film and silver thin film, as well as silicon. The details of the structure and function of the reflector 40 will be described below.

In this embodiment, the photodetector 50 is directly or indirectly supported by the support face 11a of the base 10, and disposed at a position opposite to the laser diodes with reference to the reflector 40. The photodetector 50 monitors the output of the laser beam 14a emitted by the first laser diode 30a and the output of the laser beam 14b emitted by the second laser diode 30b. The photodetector 50 includes a first light receiving element that receives a portion of the laser beam 14a from the first laser diode 30a as light to be monitored, and a second light receiving element that receives a portion of the laser beam 14b from the second laser diode 30b as light to be monitored. An example of a light receiving element is a photoelectric conversion element such as a photodiode. The operation of the photodetector 50 will be described below.

The cap 60 is a plate-shaped member and is fixed to the upper end face 12a of the base 10. More specifically, the upper end face 12a of the base 10 is bonded to the main face 60b of the cap 60. The cap 60 hermetically seals the first laser diode 30a and the second diode 30b in the space defined by the wall part 12 of the base 10. The hermetic seal can reduce the dust collection effect of the laser beams. However, a hermetic seal is not essential.

The cap 60 has a light transmitting part 61 that transmits the laser beams 14 reflected upwards by the reflector 40. The light transmitting part 61 is provided in the position in the cap 60 that goes across the laser beams 14. At least the light transmitting part 61 of the cap 60 can be formed with, for example, glass or a transparent ceramic material. Glass can contain sapphire and a phosphor. The part of the cap 60 other than the light transmitting part 61 can be formed with glass or a material other than glass, for example, the same material as that used to form the base 10. The surface of the part other than the light transmitting part 61 can be covered with a light shielding film. The light transmitting part 61 can be covered with an anti-reflective film.

The functions and structures of the reflector 40 and the photodetector 50 will be described in detail with reference to FIG. 4.

Figure 4:
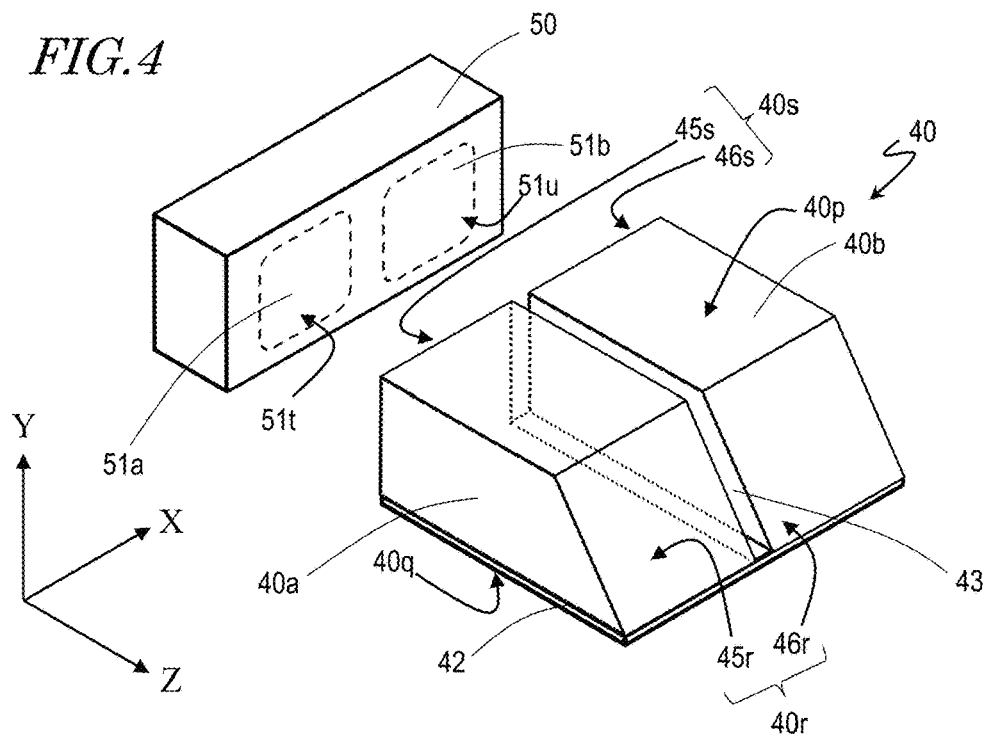
FIG. 4 is a schematic diagram separately showing a reflector and a photodetector.

FIG. 4 is a schematic diagram separately showing the reflector 40 and the photodetector 50. The reflector 40 has multiple sections divided per laser diode. The reflector 40 in this embodiment has a first part 40a and a second part 40b. The reflecting face 40r includes a first reflecting face 45r and a second reflecting face 46r, and the exit face 40s includes a first exit face 45s and a second exit face 46s. The first part 40a is a portion of the reflector 40 defined by the first reflecting face 45r and the first exit face 45s, and the second part 40b is another portion of the reflector 40 defined by the second reflecting face 46r and the second exit face 46s.

The first reflecting face 45r reflects a portion, and transmits another portion, of the laser beam 14a from the first laser diode 30a. The second reflecting face 46r reflects a portion, and transmits another portion, of the laser beam 14b from the second laser diode 30b. The first exit face 45s allows the portion of the light transmitted through the first reflecting face 45r to exit. The second exit face 46s allows the portion of the light transmitted through the second reflecting face 46r to exit. In other words, the first exit face 45s releases the light to be monitored of the first laser diode 30a. The second exit face 46s releases the light to be monitored of the second laser diode 30b. The reflectance of each reflecting face will be explained in detail below.

The photodetector 50 is disposed on the rear face side, i.e., the exit face 40s side, of the reflector 40 so as to allow the first exit face 45s and the second exit face 46s of the reflector 40 to respectively face the light receiving face 51t of the first light receiving element 51a and the light receiving face 51u of the second light receiving element 51b. The photodetector 50 is preferably disposed on the exit face 40s side of the reflector 40 such that the light receiving face 51t and the light receiving face 51u are respectively in contact with the first exit face 45s and the second exit face 46s.

The first light receiving element 51a receives the light exiting the first exit face 45s. The second light receiving element 51b receives the light exiting the second exit face 46s. As described above, the light intensity distribution of each laser beam 14 distant from the emission end face is a Gaussian distribution, the light in the peak intensity portion of this distribution is stable. Accordingly, disposing the photodetector 50 in a position opposite to that of the laser diodes with respect to the reflector 40 allows the light in the central portion of each laser beam to be monitored, thereby improving the monitoring accuracy.

The reflector 40 is a light shielding body that hinders the light transmitted through the first reflecting face 45r from exiting the second exit face 46s while hindering the light transmitted through the second reflecting face 46r from exiting the first exit face 45s. Various structures can be employed for the light shielding body. Several representative structures will be explained below.

The reflector 40 has a light shielding part 43 as a light shielding body positioned between the first part 40a and the second part 40b. In the example shown in FIG. 4, the reflector 40 is disposed on a plate 42. The reflector 40 can be integrally formed with the plate 42, or formed as a separate member from the plate 42. The plate 42 is not essential. The light shielding part 43 is formed in a slit shape between the first part 40a and the second part 40b. The light shielding part 43 is a groove extending along a plane parallel to a YZ plane. Because of this groove, an air layer is interposed between the first part 40a and the second part 40b. To explain in more detail, the light shielding part 43 is formed by making a cut in the upper face 40p, the reflecting face 40r, and the exit face 40s of the reflector 40. The slit width can be, for example, in a range of about 0.02 mm to about 0.5 mm, preferably 30 µm. The first part 40a, the second part 40b, and the light shielding part 43 between them can be relatively easily formed by, for example, forming a slit-shaped groove in the reflector 40 by a cutting process such as laser dicing or blade dicing. Furthermore, performing a cutting process can roughen the surfaces of the light shielding part 43. Light can be scattered by the rough surfaces, thereby hindering the light from one of the first and second parts 40a and 40b from entering the other. This will be more specifically explained below.

FIG. 3 shows how the laser beams 14 from the first laser diode 30a and the second laser diode 30b pass through the reflector 40. First, a reflector 40 without a light shielding body will be discussed. As described above, because a laser beam emitted by a laser diode diverges, the light transmitted through the first reflecting face 45r and advancing in the reflector 40 can reach the second exit face 46s. As a result, a portion of the light transmitted through the first reflecting face 45r exits the second exit face 46s. Similarly, the light transmitted through the second reflecting face 46r and advancing in the reflector 40 can reach the first exit face 45s. As a result, a portion of the light transmitted through the second reflecting face 46r exits the first exit face 45s. In other words, the light to be monitored of the first laser diode 30a exiting the first exit face 45s can include a portion of the laser beam from the second laser diode 30b mixed therein, and the light to be monitored of the second laser diode 30b exiting the second exit face 46s can include a portion of the laser beam from the first laser diode 30a mixed therein. Such a presence of mixed light can more readily occur when the spacing between two adjacent laser diodes is relatively small, for example, 1.0 mm or smaller.

According to this embodiment, a light shielding part 43 is provided in the reflector 40 as shown in FIG. 3. Accordingly, the vast majority of the light transmitted through the first reflecting face 45r and advancing towards the second exit face 46s is reflected by a surface of the light shielding part 43, for example, the interface with the air layer. Even if a portion of the light passes through the surface, the light would be scattered or attenuated before reaching the second exit face 46s. Accordingly, the light is hindered from entering from the first part 40a into the second part 40b. Similarly, the vast majority of the light transmitted through the second reflecting face 46r and advancing towards the first exit face 45s is reflected by a surface of the light shielding part 43. Accordingly, the light is hindered from entering from the second part 40b into the first part 40a. This may reduce intermixing of a portion of the laser beam from the second laser diode 30b with the light to be monitored of the first laser diode 30a, and intermixing of a portion of the laser beam from the first laser diode 30a with the light to be monitored of the second laser diode 30b. Accordingly, the first light receiving element 51a and the second light receiving element 51b can respectively detect with high accuracy the light to be monitored of the first laser diode 30a and the second laser diode 30b.

A light shielding film can be formed on the surfaces of the light shielding part 43. A metal film having a thickness of about 100 nm can be formed on the surfaces of the slit by sputtering. Alternatively, a light shielding material can be formed in part of or entirety of the light shielding part 43. Alternatively, a metal plate or the like having light shielding properties can be inserted in the light shielding part 43. Employing an additional light shielding film or light shielding material enables the light shielding part 43 to more effectively perform its function as a light shielding body. This, as a result, allows the first light receiving element 51a and the second light receiving element 51b to respectively detect the light to be monitored of the first laser diode 30a and the light to be monitored of the second laser diode 30b with even higher accuracy.

The light shielding part 43 can be formed by making a cut in one portion of the reflector 40. The light shielding part 43 can be a recess formed in at least one of the upper face 40p, the lower face 40q, the reflecting face 40r, and the exit face 40s of reflector 40. One example of such a recess is a slit-shaped or notched groove. FIG. 5, FIG. 6, FIG. 7A, and FIG. 7B show variations of the structures of the reflector 40.

Figure 5:
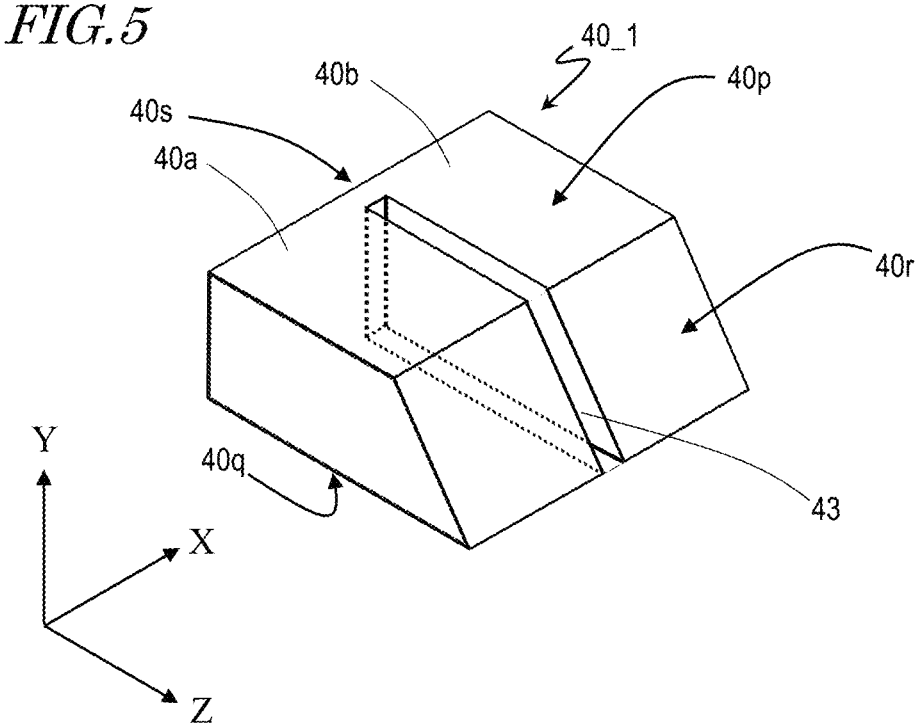
FIG. 5 is a perspective view showing an example using a variation of the reflector.
Figure 6:
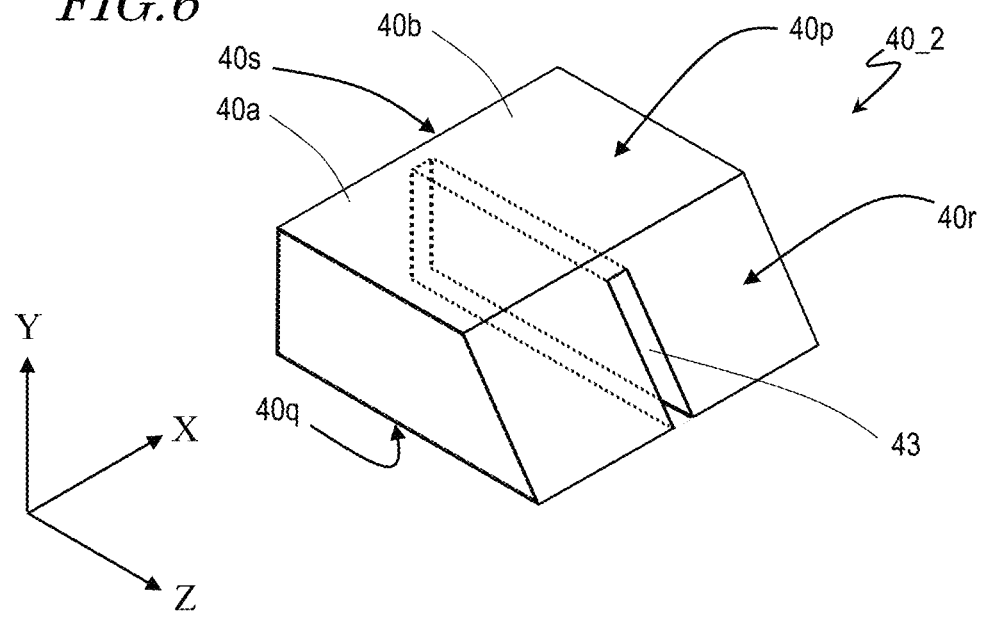
FIG. 6 is a perspective view showing another configuration using a variation of the reflector.

In the example shown in FIG. 5, the light shielding part 43 is a slit-shaped groove formed by making a cut in the upper face 40p, the lower face 40q, and the reflecting face 40r of a reflector 40_1. The groove is relatively deep nearly reaching the exit face 40s. In the example shown in FIG. 6, the light shielding part 43 is a slit-shaped groove formed by making a cut in the lower face 40q, the reflecting face 40r, and the exit face 40s of a reflector 40_2. The groove is relatively deep, nearly reaching the upper face 40p.

Figure 7A:
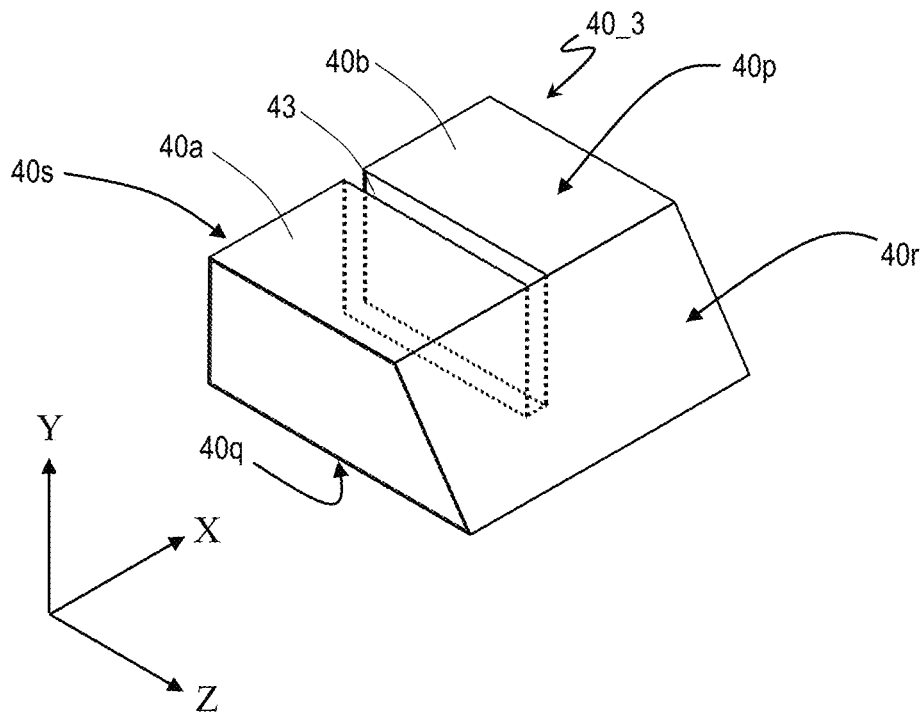
FIG. 7A is a perspective view showing another example using a variation of the reflector.
Figure 7B:
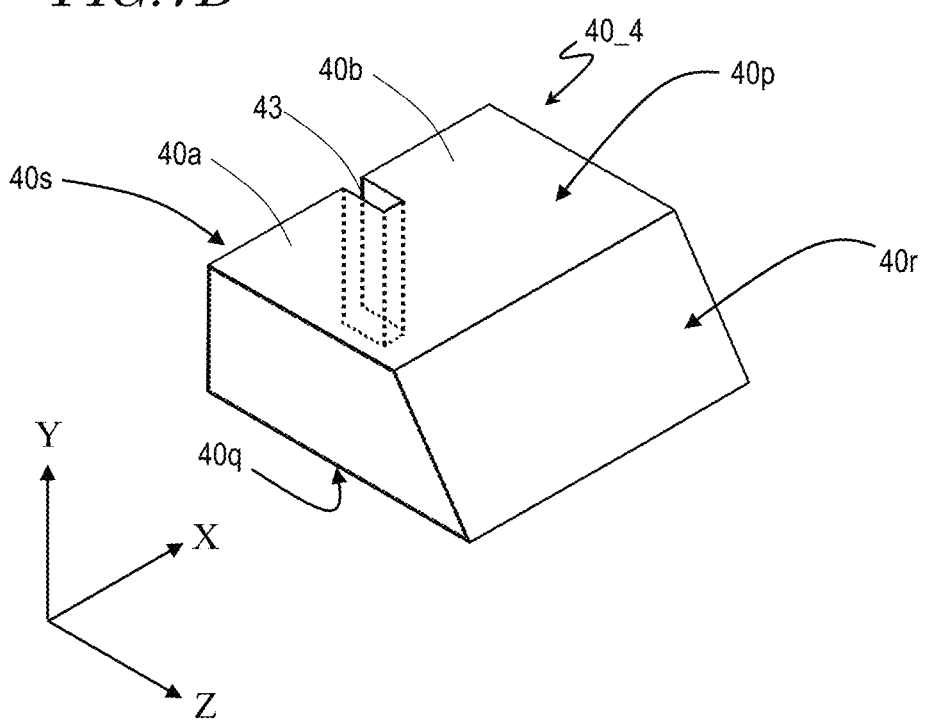
FIG. 7B is a perspective view showing another example using a variation of the reflector.

In the example shown in FIG. 7A, the light shielding part 43 is a slit-shaped groove formed by making a cut in the upper face 40p, the lower face 40q, and the exit face 40s of a reflector 40_3. The groove is relatively deep nearly reaching the border between the upper face 40p and the reflecting face 40r. The recess does not have to be a relatively deep groove formed in a slit shape, and can be a relatively shallow groove formed by making a notch. FIG. 7B shows an example of a reflector 40_4 formed by making a cut shallower than a groove. The light shielding part 43 is a relatively shallow groove formed by making a cut in the upper face 40p, the lower face 40q, and the exit face 40s of the reflector 40_4. Making a cut at least in the exit face 40s of the reflector 40_4 allows the light shielding body to perform its function because the laser beam from a laser diode diverges as explained with reference to FIG. 3. In the examples shown in FIG. 5 to FIG. 7B, a light shielding film can be formed on the surfaces of the light shielding part 43, or a light shielding material is formed in the light shielding part 43.

A light reflection controlling film, which reflects a portion and transmits a portion of the incident light, can be formed on the first reflecting face 45*r* and the second reflecting face 46*r*. The light reflection controlling film can be, for example, a thin film of a metal, such as Ag, Al, or the like. Alternatively, the light reflection controlling film can be a dielectric multilayer film, such as $Ta_2O_5/SiO_2$, $TiO_2/SiO_2$, $Nb_2O_5/SiO_2$, or the like. The reflectance of the light reflection controlling film can be adjusted based on the output of the laser diode employed.

The reflectances of the first reflecting face 45*r* and the second reflecting face 46*r* are preferably set, for example, in a range of 90% to 99% with respect to the peak wavelength of the light to be reflected. In other words, the transmittances of the first reflecting face 45*r* and the second reflecting face 46*r* are preferably set, for example, in a range of 1% to 10%, for example.

The reflectance of the reflecting faces can be controlled by changing the film thickness of, or the material used for, the light reflection controlling film. This means that the amount of the light to be monitored can be controlled. For example, in the case of employing a laser diode having an average output of 500 mW, light to be monitored of 5 mW at most can be obtained by setting the transmittance of the light reflection controlling film as 1%. In the case of employing a laser diode having an average output of 100 mW, light to be monitored of 5 mW at most can be obtained by setting the transmittance of the light reflection controlling film as 5%. Light to be monitored of a desired output relative to a laser beam of any output can be obtained by adjusting the reflectance of the light reflection controlling film light to be monitored. Furthermore, reducing the amount of light transmitted through the reflector 40 can inhibit the decline in the use efficiency of the light that is externally output. As a result, the photodetector can detect the light to be monitored with high accuracy while the light source device maintains high output.

According to this embodiment, an RGB light source device can be miniaturized by mounting at least two laser diodes having different peak wavelengths in one package, as compared to producing a light source device that uses separate laser diode packages for each color. For example, an RGB light source device can be achieved by combining a blue light emitting laser diode package and a package in which a red light emitting laser diode and a green light emitting laser diode are mounted.

Examples of light source devices that include three or more laser diodes will be described below with reference to FIG. 8 to FIG. 11.

Figure 8:
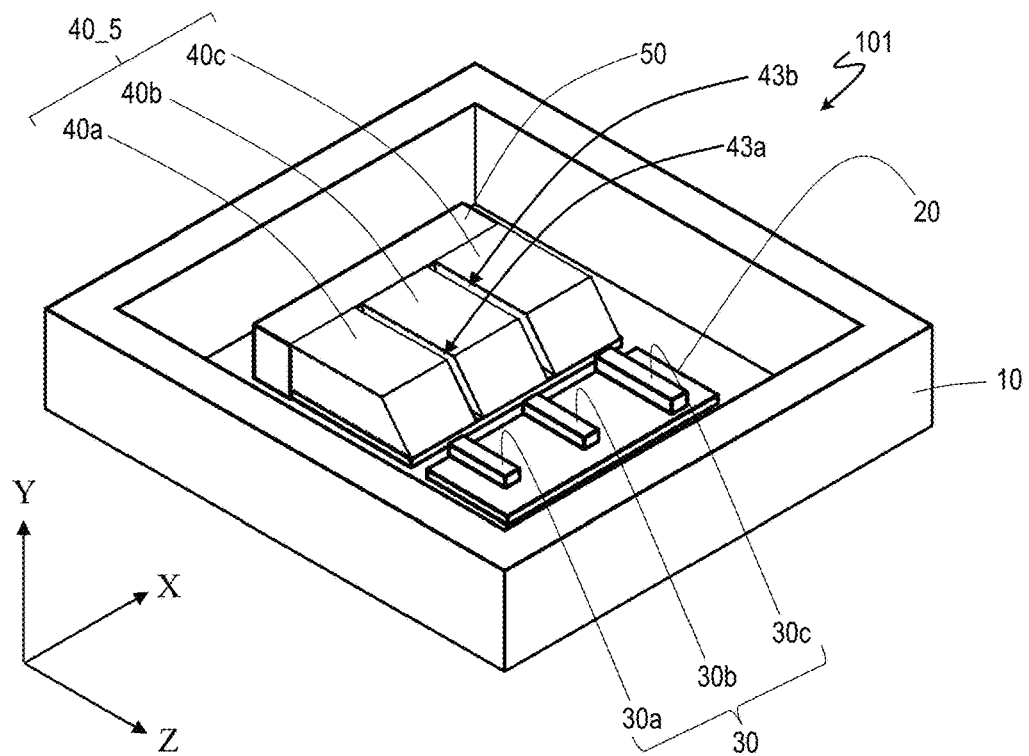
FIG. 8 is a perspective view showing an example of a light source device including three laser diodes according to an illustrative embodiment of the present disclosure.
Figure 9:
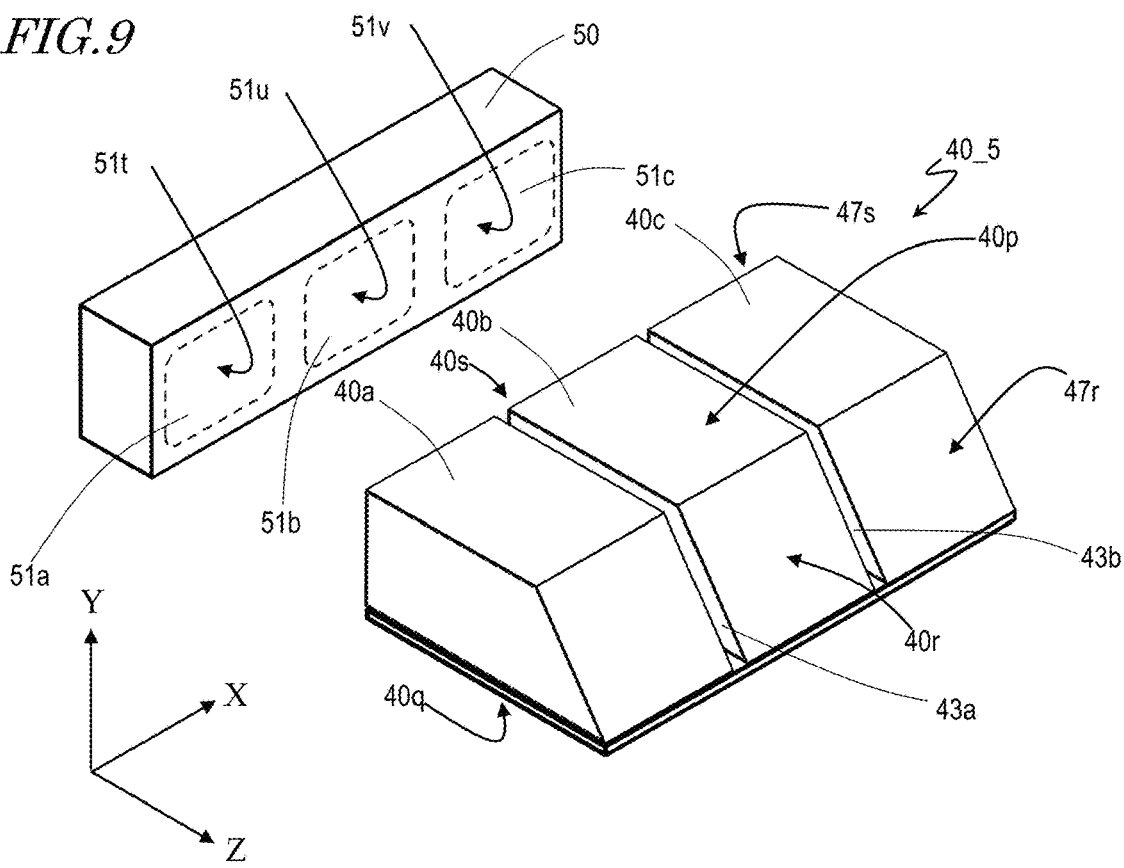
FIG. 9 is a schematic view separately showing the reflector and the photodetector of the light source device including three laser diodes according to the illustrative embodiment of the present disclosure.

FIG. 8 is a perspective view of a light source device 101 according to the embodiment. FIG. 9 is a schematic diagram separately showing the reflector 40_5 and the photodetector 50 of the light source device 101. The light source device 101 differs from the light source device 100 described above in that it includes three laser diodes 30*a*, 30*b*, and 30*c* arranged on a submount 20. The differences from the light source device 100 will be described below, while omitting the explanation of the common features.

In the example shown in FIG. 8, the laser diodes include a first laser diode 30*a*, a second laser diode 30*b*, and a third laser diode 30*c*. For example, the first laser diode 30*a* is a blue light emitting laser diode. The second laser diode 30*b* is a green light emitting laser diode. The third laser diode 30*c* is a red light emitting laser diode. The layout of the laser diodes is not limited to that described above, and for example, a blue light emitting second laser diode 30*b* can be disposed between a red light emitting first laser diode 30*a* and a green light emitting third laser diode 30*c*.

The reflector 40_5 further has a third reflecting face 47*r* that reflects a portion and transmits a portion of the laser beam from the third laser diode 30*c*, and a third exit face 47*s* that allows the light transmitted through the third reflecting face 47*r* to exit. The photodetector 50 further incudes a third light receiving element 51*c* that receives the light exiting the third exit face 47*s*. The third exit face 47*s* faces the light receiving face 51*v* of the third light receiving element 51*c* of the photodetector 50.

The reflector 40_5 has a first part 40*a*, a second part 40*b*, and a third part 40*c*. The third part 40*c* is the part of the reflector 40_5 that is defined by the third reflecting face 47*r* and the third exit face 47*s*. A light shielding part 43*a* is provided between the first part 40*a* and the second part 40*b*, and a light shielding part 43*b* is provided between the second part 40*b* and the third part 40*c*. In other words, the light source device 101 has light shielding body between two adjacent parts. The light shielding part 43*b* positioned between the second part 40*b* and the third part 40*c* hinders the light transmitted through the second reflecting face 46*r* from exiting the third exit face 47*s* while hindering the light transmitted through the third reflecting face 47*r* from exiting the second exit face 46*s*.

According to this embodiment, for example, a miniature light source device in which laser diodes of three primary colors (RGB) are mounted can be provided.

Figure 10:
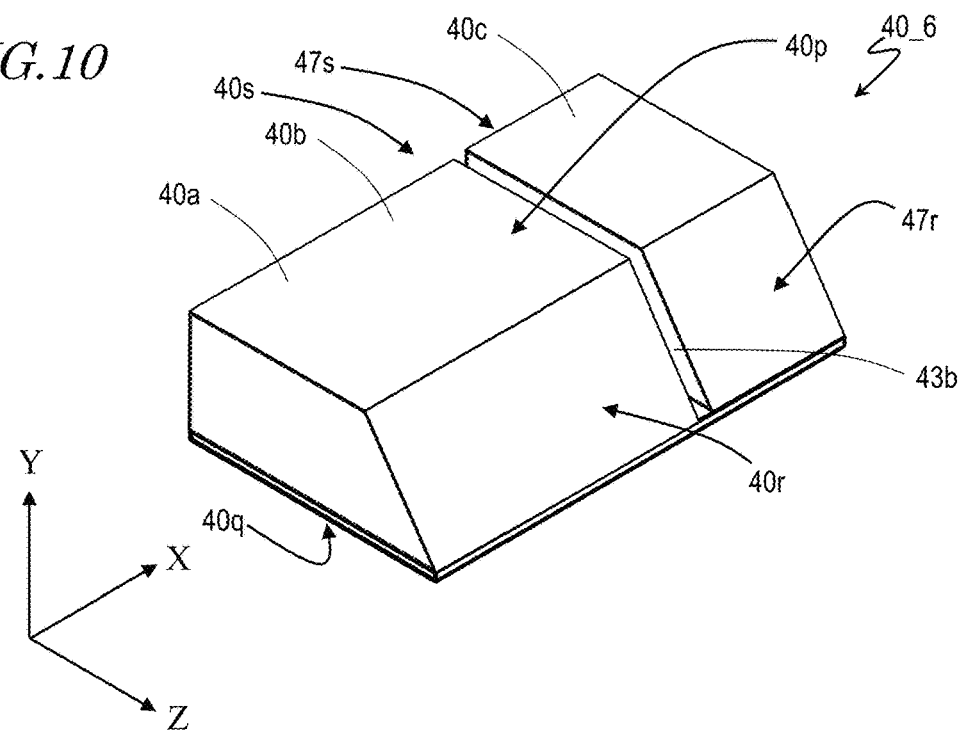
FIG. 10 is a perspective view of another example of the reflector.

FIG. 10 shows a reflector 40_6 according to another example. In the reflector 40_6, a light shielding part 43*b* is provided between the second part 40*b* and the third part 40*c*, but no light shielding body is provided between the first part 40*a* and the second part 40*b*. For example, in the case of combining blue and red laser diodes among RGB where their peak wavelengths are most distant from one another, the farthest interval between the wavelengths detected by the light receiving elements. In this case, a light shielding body is not required between the corresponding parts of the reflector 40_6. Furthermore, in the case of a combination of laser diodes having the same peak wavelength, a light shielding body is not required between the corresponding parts if individual monitoring of the laser output is unnecessary.

Figure 11:
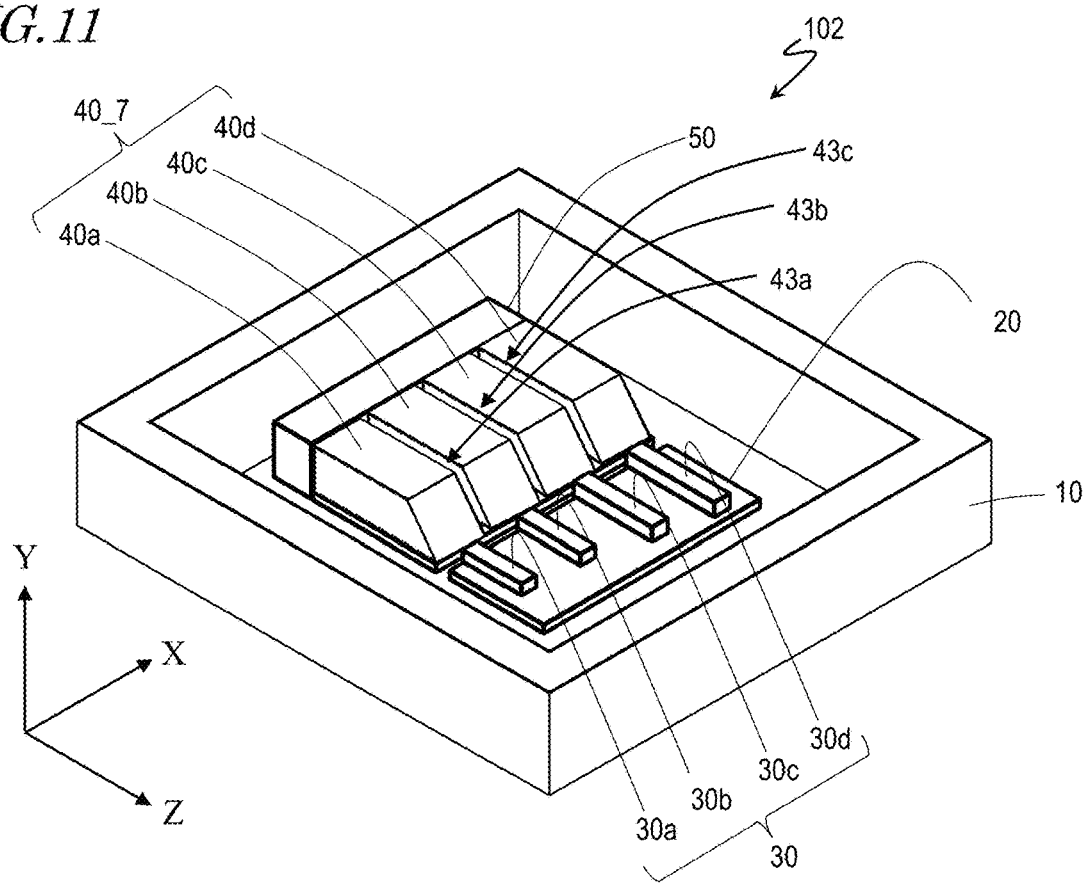
FIG. 11 is a schematic perspective view of an example of a light source device including four laser diodes according to an illustrative embodiment of the present disclosure.

FIG. 11 is a perspective view of a light source device 102 in which four laser diodes are provided.

In this embodiment, the number of laser diodes disposed on the submount 20 is not limited to two or three, and can be four, five, or more. In the example shown in FIG. 11, the laser diodes 30 include a first laser diode 30*a*, a second laser diode 30*b*, a third laser diode 30*c*, and a fourth laser diode 30*d*. The laser beam emitted by each laser diode can have any peak wavelength. For example, the first laser diode 30*a* is a laser diode that emits blue light. The second laser diode 30*b* is a laser diode that emits green light. The third laser diode 30*c* is a laser diode that emits red light. The fourth laser diode 30*d* is a laser diode that emits infrared light. Although not shown in any drawing, mounting five or more laser diodes in one package can produce a higher output light source device.

The reflector 40_7 includes a first part 40*a*, a second part 40*b*, a third part 40*c*, and a fourth part 40*d*. The photodetector 50 includes a first light receiving element, a second light receiving element, a third receiving element, and a fourth light receiving element respectively receiving the lights to be monitored of the first laser diode 30*a*, the second laser diode 30b, the third laser diode 30c, and the fourth laser diode 30d. In the reflector 40_7, a light shielding part 43a is provided between the first part 40a and the second part 40b, a light shielding part 43b is provided between the second part 40b and the third part 40c, and a light shielding part 43c is provided between the third part 40c and the fourth part 40d.

Figure 12:
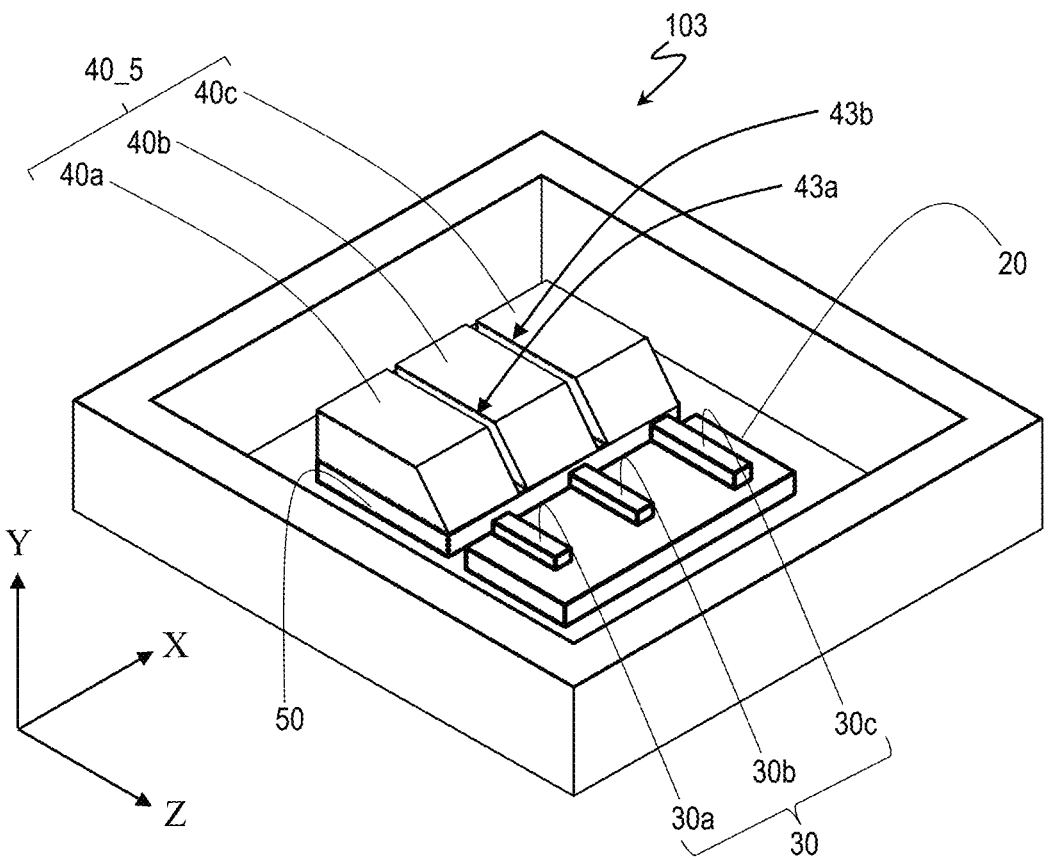
FIG. 12 is perspective view schematically showing an example using a variation of the light source device according to an illustrative embodiment of the present disclosure.
Figure 13:
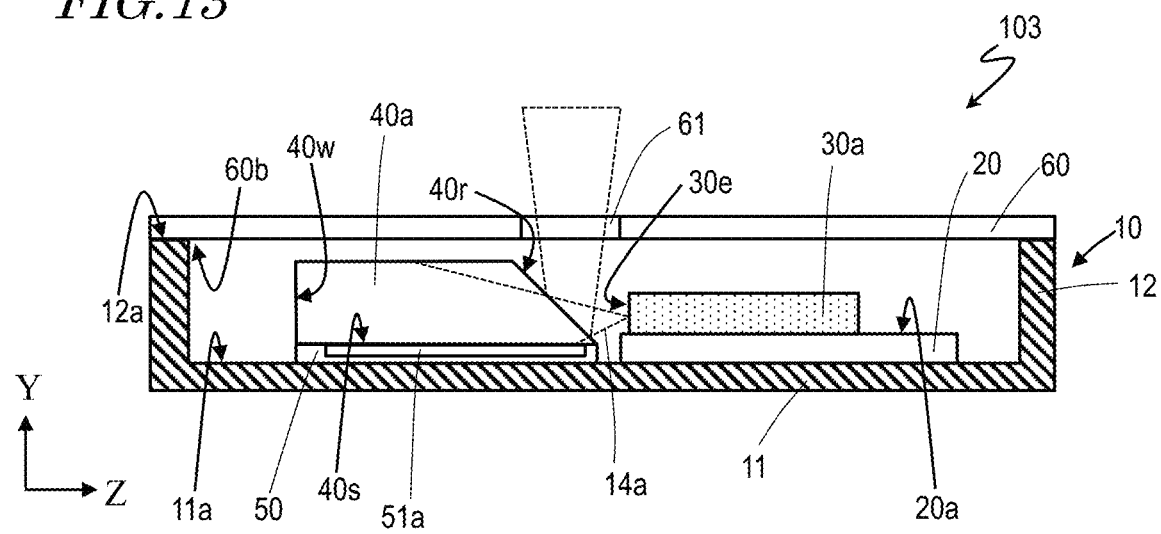
FIG. 13 is a cross-sectional view of the variation of the light source device according to the illustrative embodiment of the present disclosure taken in parallel with a YZ plane.
Figure 14:
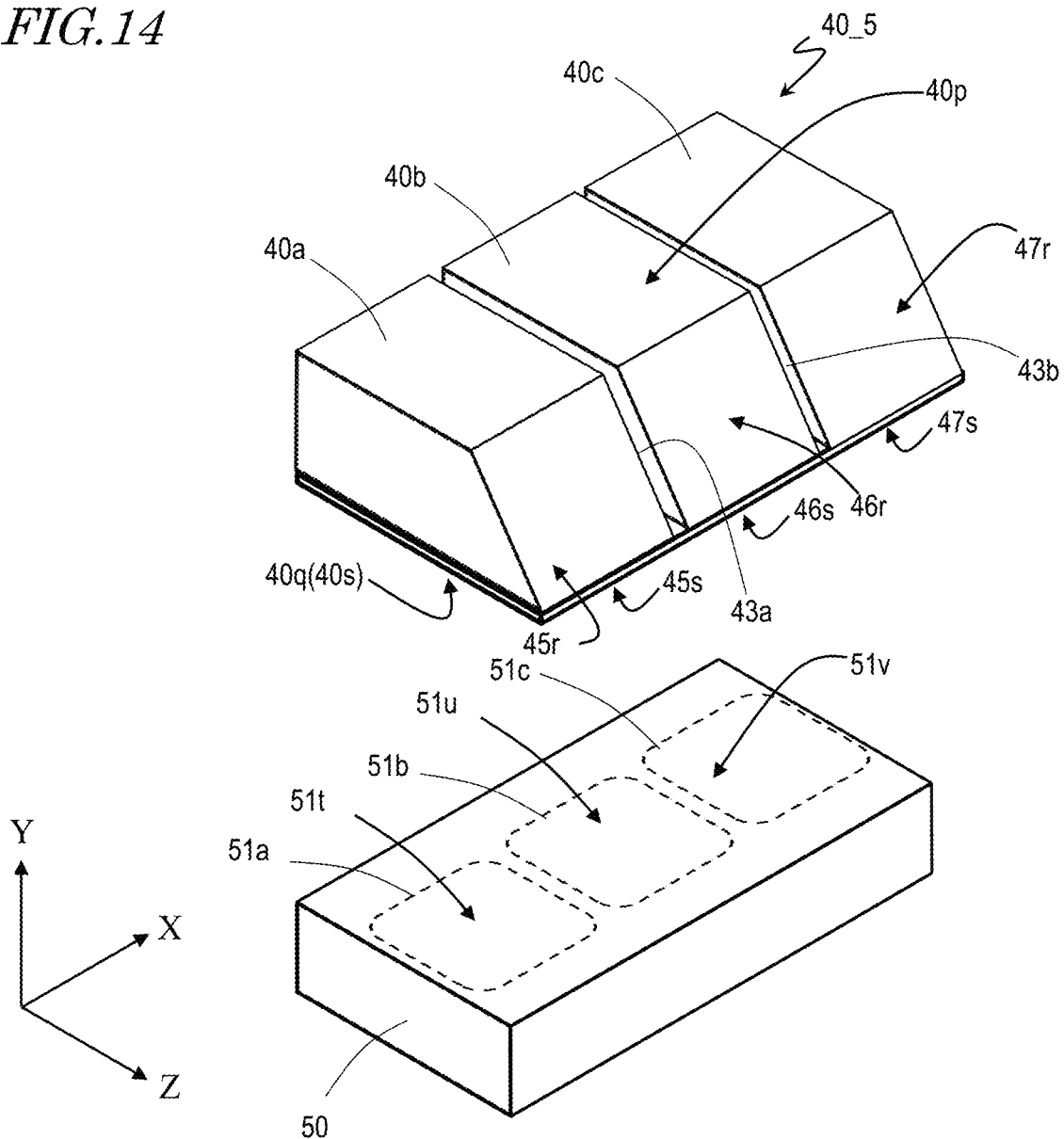
FIG. 14 is a schematic diagram separately showing the reflector and the photodetector of the variation of the light source device according to the illustrative embodiment of the present disclosure.

Variations of the light source device 100 according to the embodiment will be explained with reference to FIG. 12 to FIG. 15. FIG. 12 is a perspective view schematically showing an example of a variation of the light source device 100 according to the embodiment. FIG. 13 is a cross-sectional view of the variation of the light source device 100 taken in parallel with a YZ plane in FIG. 12. In FIG. 13, a cross section that includes the constituent elements 30a and 40a is shown. FIG. 14 is a schematic diagram separately showing the reflector 40_5 and the photodetector 50.

The light source device 103, which is a variation of the light source device 100 according to the embodiment, differs from the light source device 101 described above in that the photodetector 50 is disposed between the base 10 and the reflector 40_5. The differences from the light source device 101 will primarily be explained below, while omitting the explanation of the common features.

In the example shown in FIG. 12, the laser diodes 30 include a first laser diode 30a, a second laser diode 30b, and a third laser diode 30c, and the reflector 40_5 includes a first part 40a, a second part 40b, and a third part 40c. The photodetector 50 includes a first light receiving element 51a, a second light receiving element 51b, and a third light receiving element 51c. In the reflector 40_5, a light shielding part 43a is provided between the first part 40a and the second part 40b, and a light shielding part 43b is provided between the second part 40b and the third part 40c. The photodetector 50 is fixed to the support face 11a of the base 10, and the reflector 40_5 is disposed on or above the photodetector 50. In other words, the photodetector 50 is positioned between the base 10 and the reflector 40_5 in the Y direction.

In this variation, the exit face 40s of the reflector 40_5 is located in the lower face 40q of the reflector 40_5 that faces the light receiving faces of the photodetector 50. The first exit face 45s of the reflector 40_5 faces the light receiving face 51t of the first light receiving element 51a of the photodetector 50. The second exit face 46s of the reflector 40_5 faces the light receiving face 51u of the second light receiving element 51b of the photodetector 50. The third exit face 47s of the reflector 40_5 faces the light receiving face 51v of the third light receiving element 51c of the photodetector 50. The light transmitted through the first reflecting face 45r of the reflector 40_5 and reaching the lower face 40q of the reflector 40_5 exits the first exit face 45s as light to be monitored. Similarly, the lights transmitted through the second reflecting face 46r and the third reflecting face 47r of the reflector 40_5 and reaching the lower face 40q of the reflector 40_5 respectively exit the second exit face 46s and the third exit face 47s as light to be monitored. The rear face 40w of the reflector 40_5 can be oblique to the exit face 40s. This can facilitate the reflection of light by the oblique rear face 40w towards the light receiving faces of the photodetector 50. This, as a result, may reduce the light returning to the laser diodes.

According to this variation, the first light receiving element 51a, the second light receiving element 51b, and the third light receiving element 51c can respectively detect the light to be monitored for the first laser diode 30a, the second laser diode 30b, and the third laser diode 30c with high accuracy. Furthermore, as compared to the case of positioning a photodetector 50 on the rear face side of the reflector 40_5, disposing the reflector 40_5 on or above the photodetector 50 fixed to the base 10 can reduce the size of the light source device 103 in the Z direction.

Figure 15:
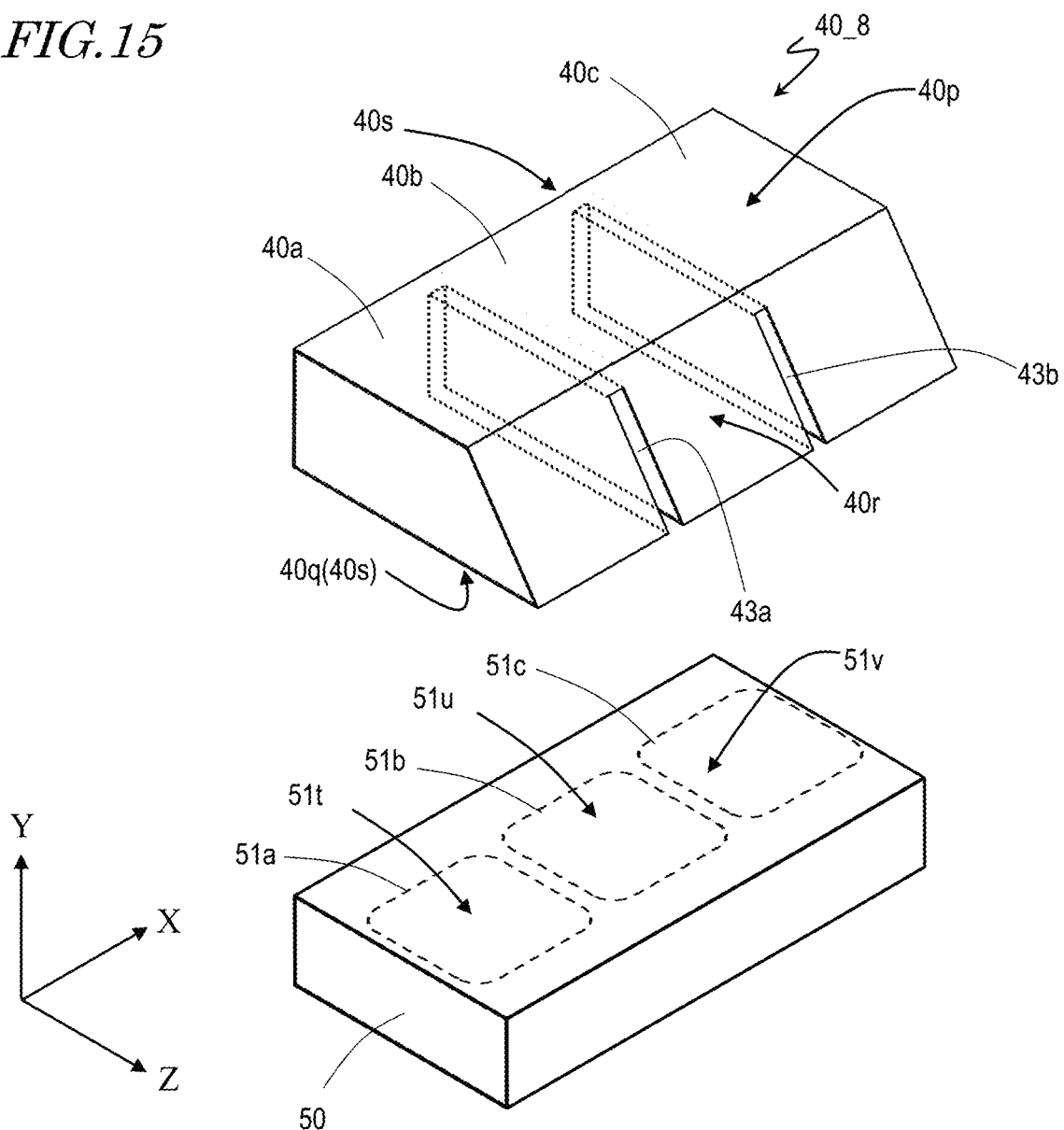
FIG. 15 is a schematic diagram separately showing the reflector and the photodetector of another variation of the light source device according to the illustrative embodiment of the present disclosure.

FIG. 15 is a schematic diagram separately showing a reflector 40_8 and a photodetector 50. The reflector 40_8 has a first part 40a, a second part 40b, a third part 40c, and two light shielding parts 43a and 43b. In the reflector 40_8 shown as an example in FIG. 15, the two light shielding parts 43a and 43b are slit-shaped grooves formed by making cuts in the lower face 40q, the reflecting face 40r, and the exit face 40s of the reflector 40_8. The grooves are relatively deep nearly reaching the upper face 40p. Also in the case of employing such a reflector structure, the light to be monitored of the first laser diode 30a, the second laser diode 30b, and the third laser diode 30c can be detected with high accuracy, while reducing the size of the light source device 103 in the Z direction.

The effect of certain light shielding body as the reflectors according to the embodiment was confirmed by using an optical simulator. The amount that the laser beam from one of two adjacent laser diodes intermixed with the laser beam from the other, in the case in which each of the reflector bodies in the Comparative Example and Examples discussed below was applied to a light source device in which laser diodes of three primary colors (RGB) were mounted, was confirmed.

Comparative Example

Figure 16A:
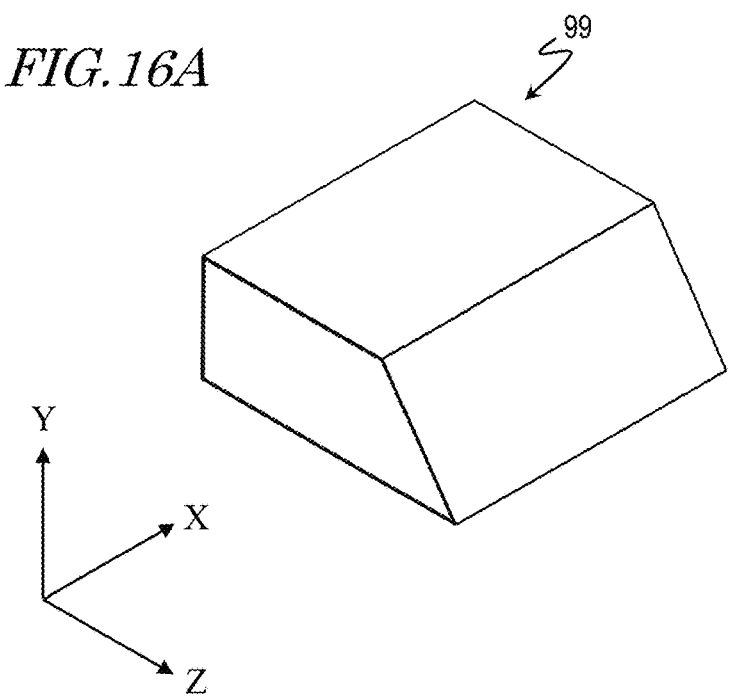
FIG. 16A is a perspective view of a reflector in a Comparative Example.
Figure 16B:
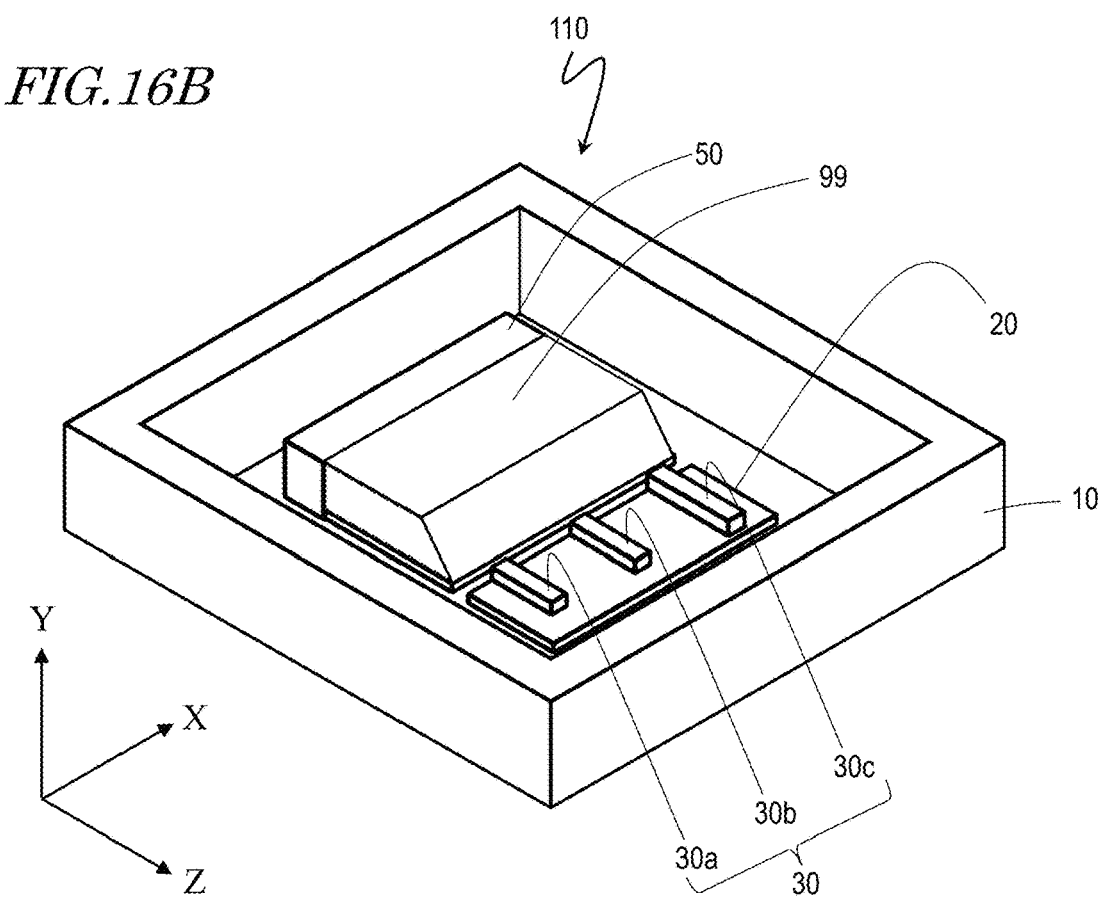
FIG. 16B is a perspective view of a light source device in the Comparative Example.

FIG. 16A shows the structure of a reflector 99 in a Comparative Example. The reflector 99 has no light shielding body, i.e., no light shielding part. As shown in FIG. 16B, a photodetector 50 that includes three light receiving faces is disposed on the rear face side of the reflector 99. The light source device 110 in the Comparative Example corresponds to the light source device 101 shown in FIG. 8 except that the reflector 40_5 is replaced with the reflector 99 described above. On the submount 20, a blue laser diode 30a and a red laser diode 30c are arranged with a green laser diode 30b interposed therebetween. The three light receiving faces of the photodetector 50 respectively receive the light to be monitored from the laser diodes 30a, 30b, and 30c.

Example 1

The light source device in Example 1 is the light source device 101 illustrated in FIG. 8. The reflector in Example 1 is the reflector 40_5 illustrated in FIG. 9, which has a first part 40a, a second part 40, a third part 30c, and two light shielding parts 43a and 43b. The light shielding parts 43a and 43b are provided between two adjacent parts. The light shielding parts are relatively deep slit-shaped grooves formed by making cuts in the upper face 40p, the reflecting face 40r, and the exit face 40s of the reflector.

Example 2

Figure 17:
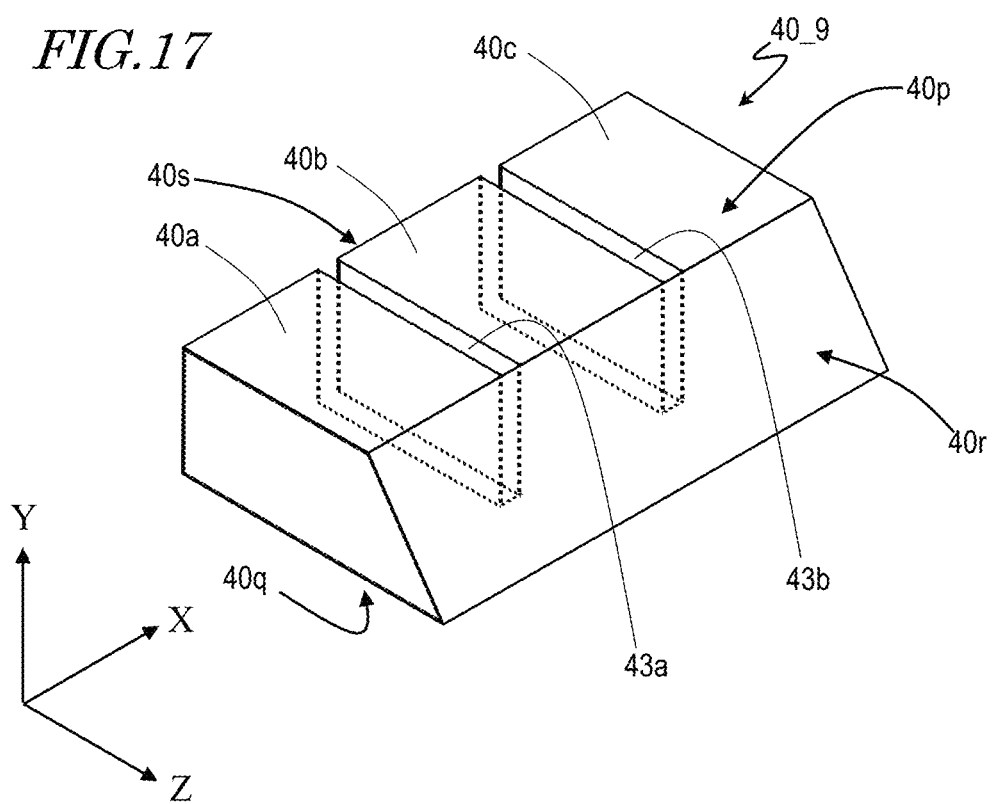
FIG. 17 is a perspective view of a reflector in Example 2.

The light source device in Example 2 corresponds to the light source device 101 illustrated in FIG. 8 except that the reflector 40_5 is replaced with the reflector 40_9 shown in FIG. 17. Similar to Example 1, the reflector 40_9 in Example 2 has a first part 40a, a second part 40b, a third part 40c, and two light shielding parts 43a and 43b. The light shielding parts are relatively deep slit-shaped grooves formed by making cuts in the upper face 40p, the lower face 40q, and the exit face 40s of the reflector.

In the simulations run on the Comparative Example and Examples, the incoherent irradiance (W/cm², hereinafter referred to as "irradiance") and the power (W) of the light incident on one of the three light receiving faces of the photodetector, i.e., the light receiving face receiving the light to be monitored from the green laser diode, were simulated under two conditions. The light receiving face subjected to the irradiance simulation (hereinafter referred to as the light receiving face T) corresponds to the light receiving face 51u illustrated in FIG. 9. Under the first condition, the red and blue laser diodes were allowed to emit light, but the green laser diode interposed between the two was not allowed to emit light. Under the second condition, only the green laser diode was allowed to emit light, but the red and blue laser diodes were not allowed to emit light.

Figure 18A:
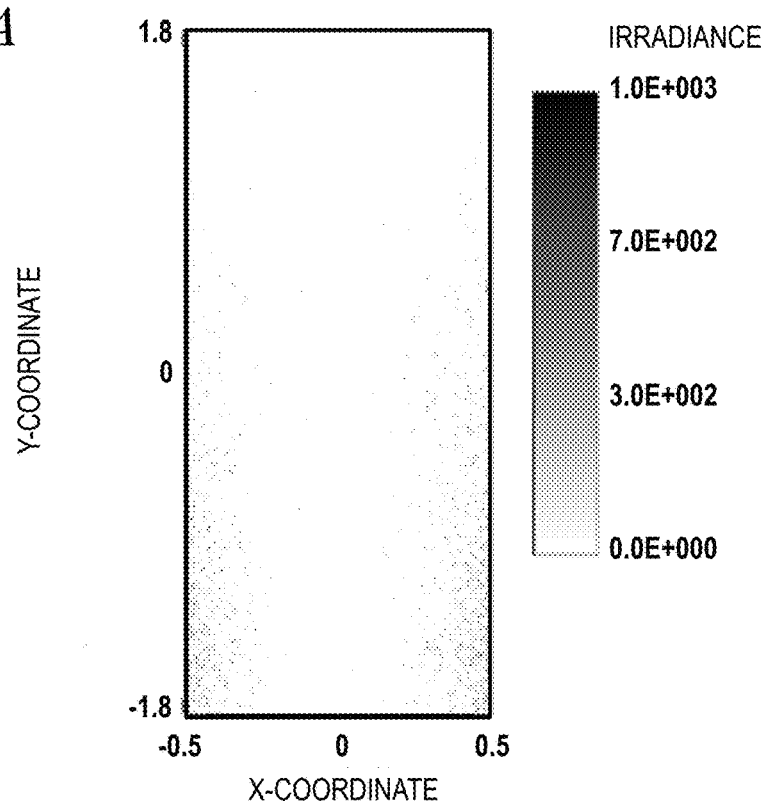
FIG. 18A is a diagram showing the simulation results in the Comparative example.
Figure 18B:
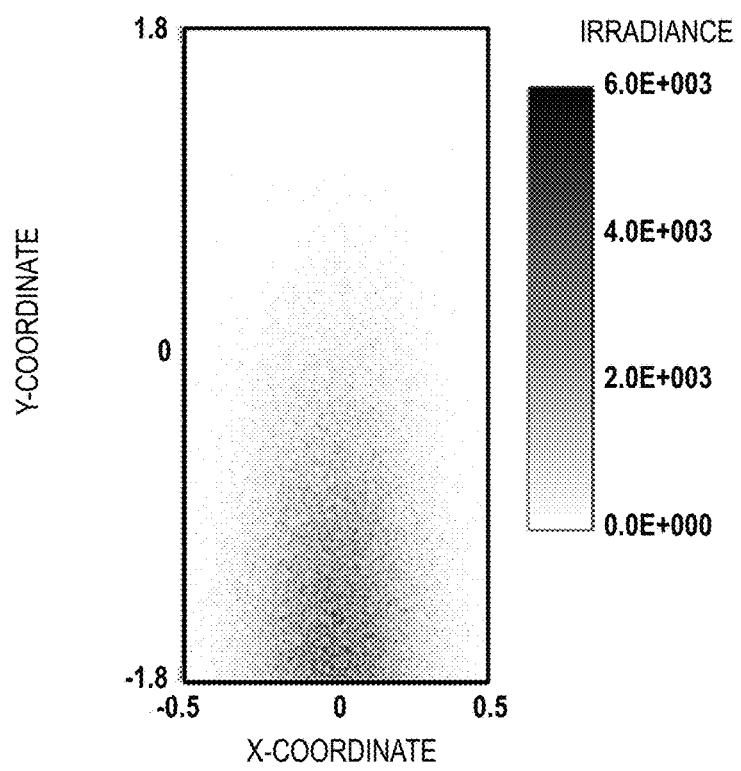
FIG. 18B is a diagram showing the simulation results in the Comparative example.

FIG. 18A shows the simulation results for the Comparative Example under the first condition. FIG. 18B shows the simulation results for the Comparative Example under the second condition. In the diagram showing the irradiance simulation results, the horizontal axis represents the X-coordinate of the light receiving face T, and the vertical axis represents the Y-coordinate of the light receiving face T. The axes of x-coordinate and y-coordinate of the light receiving face T respectively correspond to the X-axis and Y-axis of the three axes perpendicular to one another in the drawing. The ratio of the length n of the light receiving face T in the Y-axis direction to the width m in the X-axis direction (n/m) was roughly 3.6.

The total power A of the light incident on the light receiving face T measured under the first condition was $1.72 \times 10^{-2}$ W. The total power means radiant flux, and is an integrated value of the irradiance in the area of the light receiving face. The total power B of the light incident on the light receiving face T measured under the second condition was $8.16 \times 10^{-1}$ W. Here, the ratio, the total power A/the total power B, represents the noise level of the light receiving element having the light receiving face T for detecting the light to be monitored of the green laser diode. The noise was caused by a portion of the laser beam from the blue diode adjacent to the green laser diode and a portion of the laser beam from the red laser diode adjacent to the green laser diode reaching the light receiving face T. In the Comparative Example, the ratio, the total power A/the total power B, was 2.08%.

Assuming that the light receiving element outputs, for example, an 8-bit detection signal (digital signal) in correspondence with the light intensity, the percentage of signal level per gradation would be 0.39% (1/256). In the Comparative Example, the 2.08% total power A to total power B ratio was about five times the per gradation 0.39%. In other words, the noise level was considerably higher than the signal level per gradation. This, as a result, reduces the light to be monitored detection accuracy of the light receiving element for the green laser diode. This is because a portion of the blue laser beam and a portion of the red laser beam reaching the light receiving face T become the noise components of the detection signal.

Figure 19A:
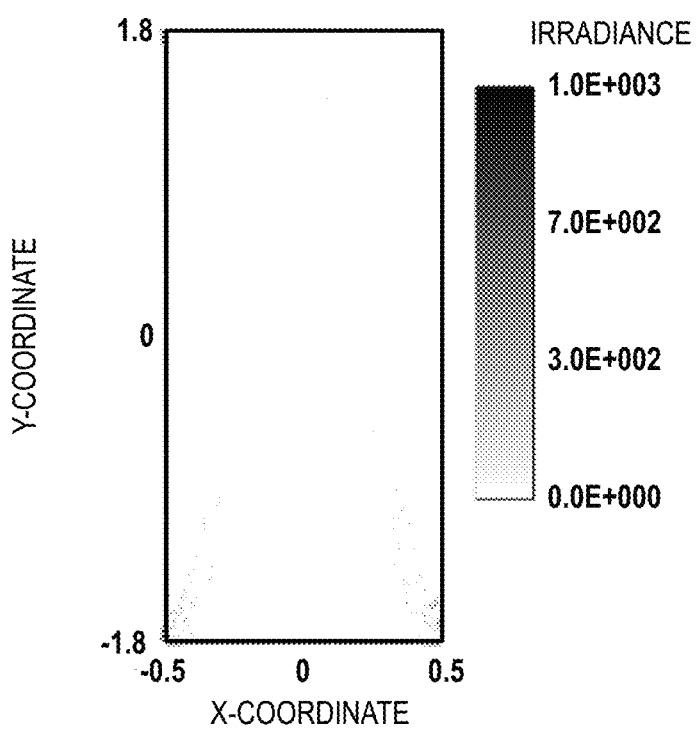
FIG. 19A is a diagram showing the simulation results in Example 1.
Figure 19B:
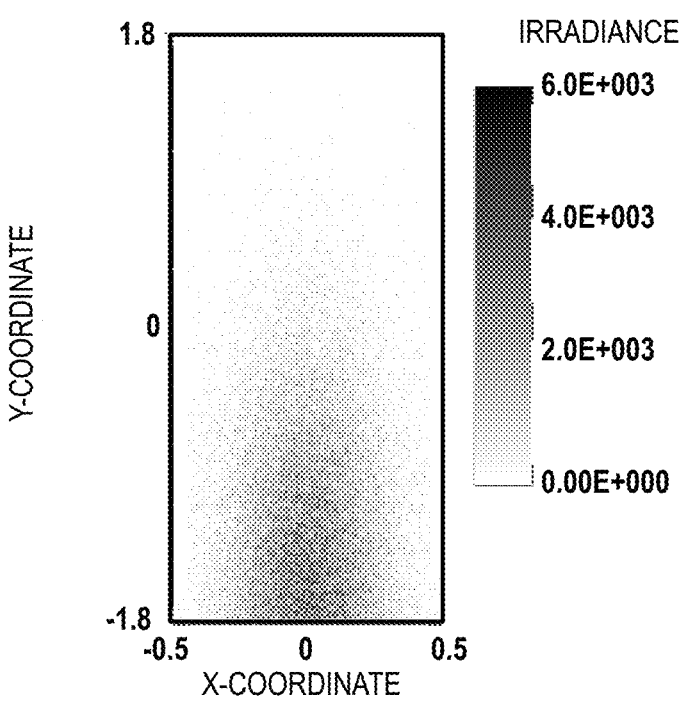
FIG. 19B is a diagram showing the simulation results in Example 1.

FIG. 19A shows the simulation results for Example 1 under the first condition. FIG. 19B shows the simulation results for Example 1 under the second condition. The total power A of the light incident on the light receiving face T measured under the first condition was $1.68 \times 10^{-3}$ W. The total power B of the light incident on the light receiving face T measured under the second condition was $8.15 \times 10^{-1}$ W. The ratio of the total power A to the total power B was 0.21%. The 0.21% total power A/total power B ratio was a smaller value than the 0.39% per gradation. In other words, it is understood that the noise level was kept lower than the signal level per gradation. The noise level was about an order of magnitude lower than that in the Comparative example. This is because the light shielding parts hindered a portion of the blue laser beam and a portion of the red laser beam from reaching the light receiving face T and, as a result, reduced the noise components in the detection signal for the green light to be monitored.

Figure 20A:
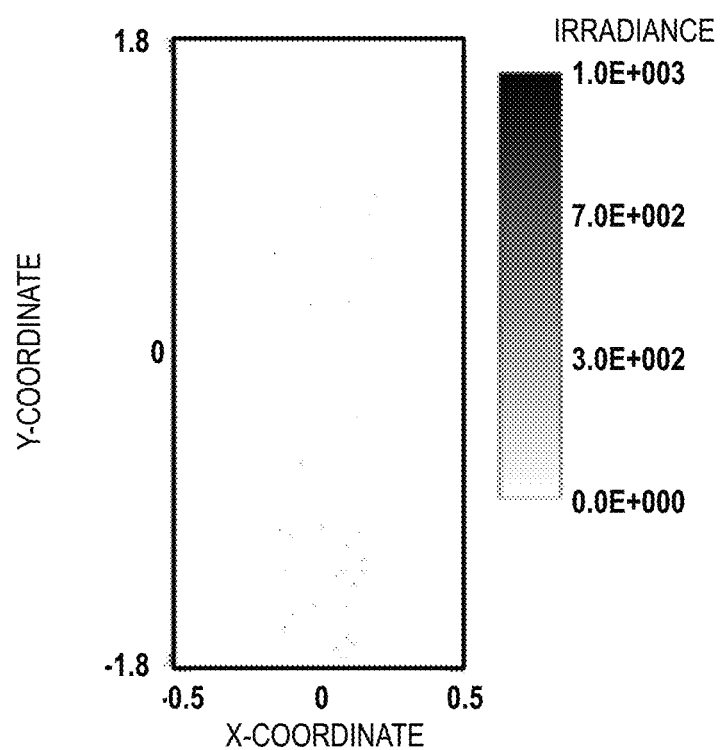
FIG. 20A is a diagram showing the simulation results in Example 2.
Figure 20B:
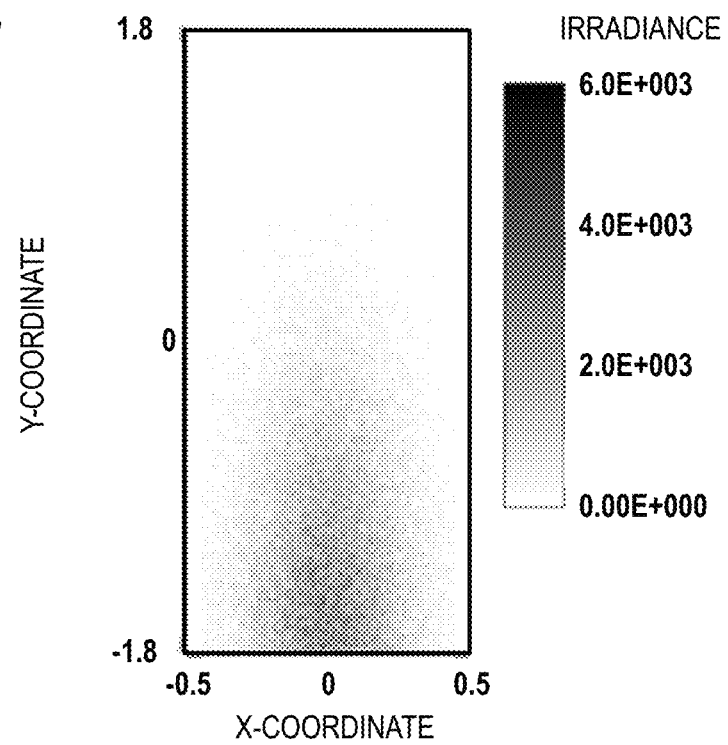
FIG. 20B is a diagram showing the simulation results in Example 2.

FIG. 20A shows the simulation results for Example 2 under the first condition. FIG. 20B shows the simulation results for Example 2 under the second condition. The total power A of the light incident on the light receiving face T measured under the first condition was $2.68 \times 10^{-4}$ W. The total power B of the light incident on the light receiving face T measured under the second condition was $8.17 \times 10^{-1}$ W. The ratio of the total power A to the total power B was 0.03%. The 0.03% total power A/total power B ratio was about an order of magnitude lower than the 0.21% in Example 1. The signal level per gradation was more than ten times the noise level. This shows that the noise level according to Example 2 was considerably lower than the signal level per gradation. This is because the light shielding parts of the reflector 40_9 was able to effectively hinder a portion of the blue laser beam and a portion of the red laser beam from reaching the light receiving face T. This, as a result, considerably reduced the noise components of the detection signal for the green light to be monitored, thereby allowing the device to detect the green light to be monitored with high accuracy. When the spacing between two adjacent laser diodes is extremely small such as 1.00 mm or less, in particular, employing the light shielding body of the reflector 40_9 is quite beneficial from the perspective of reducing the intermixing of the laser light.

The light source devices according to the present disclosure capable of monitoring laser beam outputs with high accuracy and suitable for miniaturization can be suitably utilized as miniature light sources for head-mounted displays and the like.

What is claimed is:
1. A light source device comprising:
   a first laser diode;
   a second laser diode;
   a reflector having:
      a first reflecting face configured to reflect a portion of light from the first laser diode and to transmit a portion of the light from the first laser diode,
      a second reflecting face configured to reflect a portion of light from the second laser diode and to transmit a portion of the light from the second laser diode,
      a first exit face configured to allow the portion of the light transmitted through the first reflecting face to exit, and
      a second exit face configured to allow the portion of the light transmitted through the second reflecting face to exit;
   a photodetector comprising:
      a first light receiving element configured to receive first light exiting the first exit face, and
      a second light receiving element configured to receive second light exiting the second exit face; and
   a base directly or indirectly supporting the first laser diode, the second laser diode, the reflector, and the photodetector;
   wherein the reflector comprises a light shielding part located between (i) a first part defined by the first reflecting face and the first exit face, and (ii) a second part defined by the second reflecting face and the second exit face.

2. The light source device according to claim 1, wherein the light shielding part comprises a slit located between the first part and the second part.

3. The light source device according to claim 2, further comprising a light shielding film on surfaces of the light shielding part.

4. The light source device according to claim 2, wherein a light shielding material is formed in at least part of the light shielding part.

5. The light source device according to claim 1, wherein the light shielding part comprises a recess located in at least one of an upper face of the reflector, a lower face of the reflector, the first reflecting face, the second reflecting face, the first exit face, and/or the second exit face of the reflector.

6. The light source device according to claim 1, further comprising a light reflection controlling film on the first reflecting face and the second reflecting face, the light reflection controlling film being configured to reflect a portion of incident light and to transmit a portion of the incident light.

7. The light source device according to claim 1, wherein:
the photodetector is disposed at a position opposite to that of the first laser diode and the second laser diode with respect to the reflector, and
the first exit face and the second exit face of the reflector respectively face a light receiving face of the first light receiving element and a light receiving face of the second light receiving element.

8. The light source device according to claim 1, wherein:
the photodetector is supported on an upper face of the base;
the reflector is disposed on or above the photodetector; and
the first exit face and the second exit face of the reflector respectively face the light receiving face of the first light receiving element and the light receiving face of the second receiving element.

9. The light source device according to claim 1, wherein a peak emission wavelength of the first laser diode is different from a peak emission wavelength of the second laser diode.

10. A light source device comprising:
a first laser diode;
a second laser diode;
a third laser diode;
a reflector having:
a first reflecting face configured to reflect a portion of light from the first laser diode and to transmit a portion of the light from the first laser diode,
a second reflecting face configured to reflect a portion of light from the second laser diode and to transmit a portion of the light from the second laser diode,
a third reflecting face configured to reflect a portion of light from the third laser diode and to transmit a portion of the light from the third laser diode,
a first exit face configured to allow the portion of the light transmitted through the first reflecting face to exit,
a second exit face configured to allow the portion of the light transmitted through the second reflecting face to exit, and
a third exit face that allows the light transmitted through the third reflecting face to exit;
a photodetector comprising:
a first light receiving element configured to receive first light exiting the first exit face,
a second light receiving element configured to receive second light exiting the second exit face, and
a third light receiving element configured to receive third light exiting the third exit face; and
a base directly or indirectly supporting the first laser diode, the second laser diode, the reflector, and the photodetector, wherein:
the reflector comprises:
a first part defined by the first reflecting face and the first exit face,
a second part defined by the second reflecting face and the second exit face,
a third part defined by the third reflecting face and the third exit face,
a first light shielding part positioned between the first part and the second part, and
a second light shielding part positioned between the second part and the third part.

11. The light source device according to claim 10, wherein:
the first light shielding part comprises a slit located between the first part and the second part; and
the second light shielding part comprises a slit located between the second part and the third part.

12. The light source device according to claim 10, wherein:
the first light shielding part comprises a recess located in at least one of an upper face of the reflector, a lower face of the reflector, the first reflecting face, the second reflecting face, the first exit face, and/or the second exit face of the reflector; and
the second light shielding part comprises a recess located in at least one of the upper face of the reflector, the lower face of the reflector, the second reflecting face, the third reflecting face, the second exit face, and/or the third exit face of the reflector.

* * * * *